United States Patent
Xu et al.

(10) Patent No.: US 9,331,056 B2
(45) Date of Patent: *May 3, 2016

(54) WHITE LED ASSEMBLY WITH LED STRING AND INTERMEDIATE NODE SUBSTRATE TERMINALS

(71) Applicant: Bridgelux, Inc., Livermore, CA (US)

(72) Inventors: Tao Xu, Fremont, CA (US); Michael Solomensky, Fremont, CA (US)

(73) Assignee: Bridgelux, Inc., Livermore, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/671,985

(22) Filed: Mar. 27, 2015

(65) Prior Publication Data

US 2015/0206859 A1 Jul. 23, 2015

Related U.S. Application Data

(63) Continuation of application No. 14/285,599, filed on May 22, 2014, now Pat. No. 9,012,932, which is a continuation of application No. 13/335,888, filed on Dec. 22, 2011, now Pat. No. 8,759,847.

(51) Int. Cl.
*H01L 33/58* (2010.01)
*H01L 33/00* (2010.01)
(Continued)

(52) U.S. Cl.
CPC .......... *H01L 25/0753* (2013.01); *H01L 25/167* (2013.01); *H01L 27/153* (2013.01); *H01L 33/005* (2013.01); *H01L 33/486* (2013.01); *H01L 33/50* (2013.01); *H01L 33/507* (2013.01); *H01L 33/54* (2013.01); *H01L 33/60* (2013.01); *H01L 33/62* (2013.01); *F21K 9/56* (2013.01); *F21Y 2105/005* (2013.01);
(Continued)

(58) Field of Classification Search
CPC ... H01L 25/167; H01L 25/0753; H01L 27/15; H01L 27/153; H01L 33/54; H01L 33/60; H01L 33/62; H01L 33/486; H01L 33/507; F21K 9/56; F21Y 2105/005
USPC .............. 257/40, 88, 89, 91, 98, E27.12, 257/E33.001, E33.061, E33.067; 438/22, 438/27

See application file for complete search history.

(56) References Cited

U.S. PATENT DOCUMENTS 3,969,672 A 7/1976 Wallander et al. ............. 324/133
5,463,280 A 10/1995 Johnson ........................ 315/187
(Continued)

FOREIGN PATENT DOCUMENTS

WO        WO 01/36864        5/2001

*Primary Examiner* — Dao H Nguyen
(74) *Attorney, Agent, or Firm* — Imperium Patent Works; T. Lester Wallace; Darien K. Wallace

(57) ABSTRACT

A white LED assembly includes a string of series-connected blue LED dice mounted on a substrate. The substrate has a plurality of substrate terminals. A first of the substrate terminals is coupled to be a part of first end node of the string. A second of the substrate terminals is coupled to be a part of an intermediate node of the string. A third of the substrate terminals is coupled to be a part of a second end node of the string. Other substrate terminals may be provided and coupled to be parts of corresponding other intermediate nodes of the string. A single contiguous amount of phosphor covers all the LED dice, but does not cover any of the substrate terminals. In one example, the amount of phosphor contacts the substrate and has a circular periphery. All the LEDs are mounted to the substrate within the circular periphery.

20 Claims, 6 Drawing Sheets

(51) Int. Cl.
*H01L 27/15* (2006.01)
*H01L 25/16* (2006.01)
*H01L 25/075* (2006.01)
*H01L 33/62* (2010.01)
*H01L 33/48* (2010.01)
*H01L 33/54* (2010.01)
*H01L 33/60* (2010.01)
*H01L 33/40* (2010.01)
*H01L 33/50* (2010.01)
*F21K 99/00* (2016.01)
*F21Y 105/00* (2016.01)

(52) U.S. Cl.
CPC ............ *H01L 33/405* (2013.01); *H01L 33/505* (2013.01); *H01L 2224/48091* (2013.01); *H01L 2224/48227* (2013.01); *H01L 2224/49171* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 6,016,038 A | 1/2000 | Mueller et al. | 315/291 |
| 6,150,774 A | 11/2000 | Mueller et al. | 315/291 |
| 6,234,645 B1 | 5/2001 | Borner et al. | 362/231 |
| 6,340,864 B1 | 1/2002 | Wacyk | 315/158 |
| 6,513,949 B1 | 2/2003 | Marshall et al. | 362/231 |
| 6,636,003 B2 | 10/2003 | Rahm et al. | 315/179 |
| 7,014,336 B1 | 3/2006 | Ducharme et al. | 362/231 |
| 7,224,128 B2 | 5/2007 | Hsu | 315/185 R |
| 7,377,669 B2 | 5/2008 | Farmer et al. | 362/249.01 |
| 7,683,553 B2 | 3/2010 | Fong | 315/185 R |
| 7,888,888 B2 | 2/2011 | Huang et al. | 315/307 |
| 7,906,915 B2 | 3/2011 | Coley | 315/185 S |
| 7,911,441 B2 | 3/2011 | Chao et al. | 345/102 |
| 8,018,170 B2 | 9/2011 | Chen et al. | 315/192 |
| 8,421,094 B2 * | 4/2013 | Ishizaki | F21K 9/135 257/88 |
| 8,759,847 B2 * | 6/2014 | Xu | H01L 25/0753 257/40 |
| 9,012,932 B2 * | 4/2015 | Xu | H01L 25/0753 257/40 |
| 2003/0193789 A1 | 10/2003 | Karlicek | 361/760 |
| 2009/0140271 A1 | 6/2009 | Sah | 257/88 |
| 2009/0272987 A1* | 11/2009 | Wang | H01L 25/0753 257/88 |
| 2010/0078663 A1 | 4/2010 | Shi et al. | 257/98 |
| 2010/0213475 A1* | 8/2010 | Son | H01L 25/0753 257/89 |
| 2011/0001422 A1* | 1/2011 | Aanegola | H01L 25/0753 313/501 |
| 2011/0012143 A1* | 1/2011 | Yuan | H05B 33/0821 257/91 |
| 2011/0068701 A1 | 3/2011 | van de Ven | 315/185 R |
| 2011/0186880 A1 | 8/2011 | Kohler et al. | 257/91 |
| 2011/0285323 A1 | 11/2011 | Kuo et al. | 315/307 |
| 2012/0061692 A1* | 3/2012 | Chang | H01L 25/0753 257/88 |
| 2013/0141891 A1* | 6/2013 | Funakubo | F21V 21/00 362/84 |
| 2014/0328056 A1* | 11/2014 | Lee | F21K 9/00 362/231 |

* cited by examiner

SOLDER MASK LAYER

HIGHLY REFLECTIVE LAYER OF
THE SUBSTRATE

THE PORTION OF THE TOP SURFACE OF THE
SUBSTRATE CONTACTED BY THE PHOSPHOR

METAL LAYER PORTIONS, LED
DICE, AND WIRE BONDS

| LEDS ON | HOW THE SUBSTRATE TERMINALS OF FIG. 6 ARE DRIVEN | | | |
|---|---|---|---|---|
| | T1 | T2 | T3 | T4 |
| A | L | H | F | F |
| B | F | L | H | F |
| C | F | F | L | H |
| A,B,C | L | F | F | H |
| A,B | L | F | H | F |
| B,C | F | L | F | H |
| A,C | L | H/2 | H/2 | H |

SHORT

| LEDS ON | HOW THE SUBSTRATE TERMINALS OF FIG. 12 ARE DRIVEN | | | |
|---|---|---|---|---|
| | T1 | T2 | T3 | T4 |
| A | L | H | F | F |
| B,C | F | L | H | F |
| D | F | F | L | H |
| A,B,C,D | L | F | F | H |
| A,B,C | L | F | H | F |
| B,C,D | F | L | F | H |
| A,D | L | H/2 | H/2 | H |

SHORT

US 9,331,056 B2

WHITE LED ASSEMBLY WITH LED STRING AND INTERMEDIATE NODE SUBSTRATE TERMINALS

CROSS REFERENCE TO RELATED APPLICATIONS

This application is a continuation of, and claims priority under 35 U.S.C. §120 from, nonprovisional U.S. patent application Ser. No. 14/285,599 entitled "White LED Assembly With LED String And Intermediate Node Substrate Terminals," filed on May 22, 2014, now U.S. Pat. No. 9,012,932, the subject matter of which is incorporated herein by reference. application Ser. No. 14/285,599, in turn, is a continuation of, and claims priority under 35 U.S.C. §120 from, nonprovisional U.S. patent application Ser. No. 13/335,888 entitled "White LED Assembly With LED String And Intermediate Node Substrate Terminals," filed on Dec. 22, 2011, now U.S. Pat. No. 8,759,847, the subject matter of which is incorporated herein by reference.

TECHNICAL FIELD

The present disclosure relates generally to white LED (Light Emitting Diode) assemblies.

BACKGROUND INFORMATION

A so-called white Light Emitting Diode (LED) is a solid state device that converts electrical energy into light. The white LED is actually an assembly that includes a blue LED die or blue LED dice. Within a blue LED die, light is emitted from an active layer of semiconductor materials sandwiched between oppositely doped layers when an adequate voltage is applied across the doped layers. In one example of a blue LED die, an N-type GaN layer is disposed over a substrate, an InGaN/GaN Multiple Quantum Well (MQW) active layer is disposed over the N-type layer, and a P-type GaN layer is disposed over the active layer. A first electrode makes electrical contact with the N-type layer. A second electrode makes electrical contact with the P-type layer. When a current is made to flow from the second electrode, through the LED structure, to the first electrode, then light is emitted from the active layer. The light emitted may be said to be "blue" light because the spectrum of the light emitted has a peak intensity at or close to that of blue light. To make the light emitted from the overall LED assembly "white", a layer of a material referred to generally as "phosphor" is disposed over the blue LED die. This phosphor actually involves phosphor particles suspended in a binding material such as silicone. Blue light emitted from the blue LED die is absorbed by these phosphor particles, and the phosphor particles in turn re-emit light. The light re-emitted is, however, of different wavelengths. The spectrum of all the light emitted from the overall white LED assembly is therefore broader than the spectrum of the blue light emitted from the blue LED itself. This broad spectrum roughly approximates the spectrum of white light. Such an assembly is therefore said to be a "white LED".

A white LED may involve one blue LED die, or may involve a plurality of blue LED dice that are series-connected in a string. The blue LED die or dice are mounted to a printed circuit board. A first terminal of the printed circuit board is electrically connected to a first end of the string of blue LED dice. The first end of the string is the cathode electrode of the last LED of the string. A second terminal of the printed circuit board is connected to a second end of the string of blue LED dice. The second end of the string is the anode electrode of the first LED of the string. An amount of phosphor is disposed over the LED dice to cover the LED dice but so as not to cover the substrate terminals. The substrate terminals are available for external circuitry to connect to the white LED assembly.

SUMMARY

A white LED assembly includes a string of series-connected blue LED dice mounted to a substrate. The substrate has a plurality of substrate terminals. In one example, the substrate includes a Printed Circuit Board (PCB) and a layer of a Highly Reflective (HR) material disposed over the PCB. A first of the substrate terminals is coupled to be a part of first end node of the string. A second of the substrate terminals is coupled to be a part of an intermediate node of the string. A third of the substrate terminals are coupled to be a part of a second end node of the string. Other substrate terminals may be provided. Each of these other substrate terminals is coupled to be a part of a corresponding other intermediate node of the string. A single contiguous amount of phosphor covers all the LEDs of the string, but does not cover any of the substrate terminals. The phosphor may, for example, include phosphor particles suspended in a binding material such as silicone. The single contiguous amount of phosphor contacts a portion of the top surface of the substrate and contacts no portion of the substrate other than the portion. The portion has a circular outer periphery. All the LEDs of the string are mounted to the portion of the substrate within the circular periphery.

In one example, the substrate has a rectangular shape when considered from the top-down perspective. The substrate has a first substrate terminal, a second substrate terminal, a third substrate terminal, and a fourth substrate terminal. The first substrate terminal is located closer to a first corner of the substrate than to any of the second, third and fourth corners. The second substrate terminal is located closer to the second corner than to any of the first, third and fourth corners. The third substrate terminal is located closer to the third corner than to any of the first, second and fourth corners. The fourth substrate terminal is located closer to the fourth corner than to any of the first, second and third corners. The first substrate terminal is coupled by a wire bond to a part of a first end node of the string. The second substrate terminal is coupled by wire bonds to be a part of a first intermediate node of the string. The third substrate terminal is coupled by wire bonds to be a part of a second intermediate node of the string. The fourth substrate terminal is coupled by a wire bond to be a part of a second end node of the string.

In this example with four substrate terminals located at the four corners of a rectangular substrate, the string of LEDs includes a first part coupled between the first end node and the first intermediate node, a second part coupled between the first intermediate node and the second intermediate node, and a third part coupled between the second intermediate node and the second end node of the string. Each of these parts can be single LED, or can be a string of series-connected LEDs.

Applying a voltage of adequate magnitude and polarity between the fourth substrate terminal and the first substrate terminal when the second and third substrate terminals are floating (not being driven with a voltage) causes a current to flow from the fourth substrate terminal, through the string of LEDs, and to the first substrate terminal, such that all the LEDs of the string emit light. By applying voltages across other selected pairs of the substrate terminals and allowing the remaining substrate terminals to float, certain LEDs of the string are made to emit light and other LEDs of the string are made not to emit light. Control of individual LEDs of the string facilitates dimming functions. Certain of the LEDs of the string may be covered with different phosphors. By selectively controlling the light output of these various LEDs, the spectrum of the composite light emitted from the overall white LED assembly can be adjusted and controlled.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first object is referred to as being disposed "over" a second object, it is to be understood that the first object can be directly on the second object, or an intervening object may be present between the first and second objects. Similarly, terms such as "over", "under", "underlying", "upper", "top", and "top-down" are used herein to describe relative orientations between different parts of the white LED assembly structure being described, and it is to be understood that the overall white LED assembly being described can actually be oriented in any way in three-dimensional space.

Figure 1:
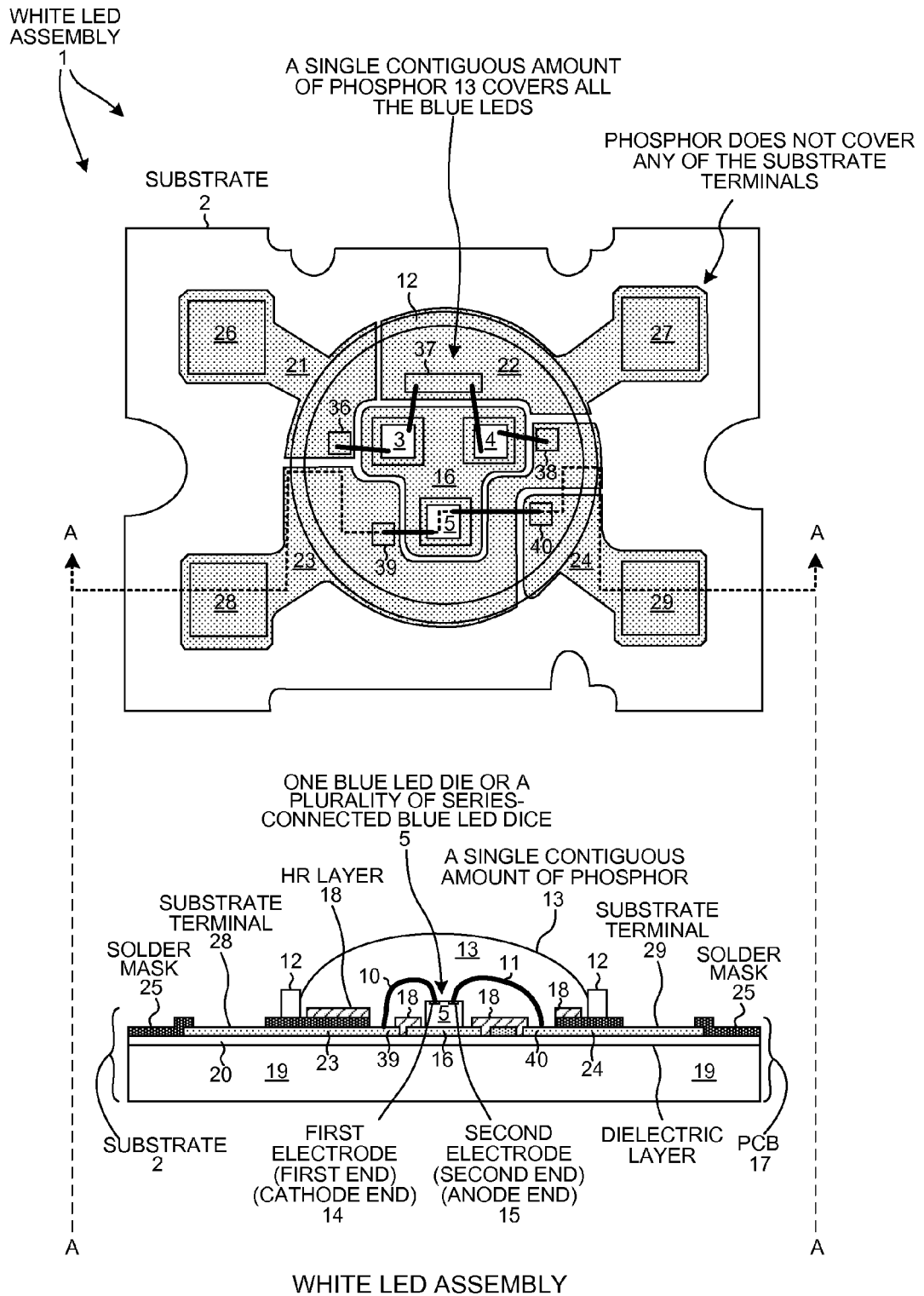
FIG. 1 is a top-down diagram and a cross-sectional diagram of a white LED assembly 1 in accordance with one novel aspect.
Figure 5:
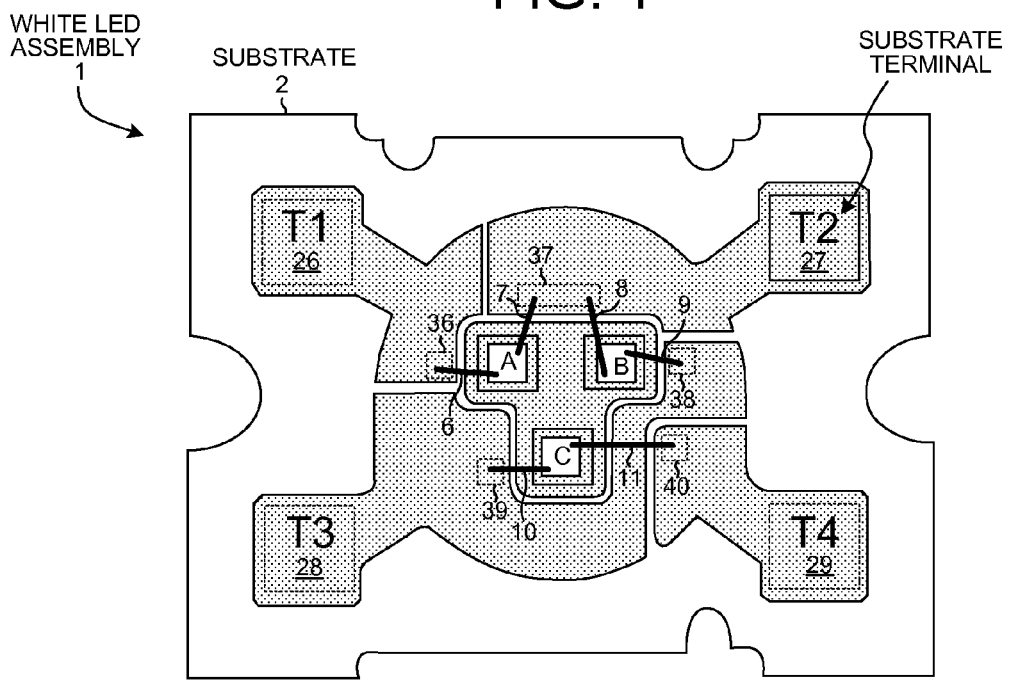
FIG. 5 is a top-down diagram showing the wire bonds in the white LED assembly of FIG. 1.

FIG. 1 is a top-down diagram and an associated cross-sectional diagram of a white LED assembly 1. The upper portion of FIG. 1 is the top-down diagram of the white LED assembly 1. The bottom portion of FIG. 1 is the cross-sectional diagram taken along dotted line A-A in the upper diagram. White LED assembly 1 includes a substrate 2, three blue LED dice 3-5, a plurality of wire bonds 6-11, a retaining ring 12, and a single contiguous amount of phosphor 13. The reference numerals for bond wires 6-11 are not shown on FIG. 1 due to space limitations on the drawing. The reference numerals for bond wires 6-11 are shown in FIG. 5.

Each of the blue LED dice 3-5 is a bare, unpackaged, lateral blue LED die. Each lateral blue LED die includes epitaxial layers including an N-type gallium-nitride (GaN) layer, an InGaN/GaN Multiple Quantum Well (MQW) active layer disposed over the N-type layer, and a P-type GaN layer disposed over the active layer. The epitaxial layers are disposed on an insulating substrate of the LED die. The insulating substrate may be sapphire. A first electrode accessible from the top of the die makes electrical contact with the N-type layer. The first electrode may be referred to as the cathode electrode. A second electrode accessible from the top of the die makes electrical contact with the P-type layer. The second electrode may be referred to as the anode electrode. In the bottom portion of FIG. 1, blue LED die 5 has a first electrode 14 and a second electrode 15. The first electrode 14 is electrically connected to the N-type layer of the blue LED die 5. The second electrode 15 is electrically connected to the P-type layer of the blue LED die 5. The epitaxial layers of blue LED die 5 are insulated from underlying central metal layer portion 16 due to the insulative substrate of the blue LED die.

Substrate 2 includes a metal core Printed Circuit Board (PCB) 17 and a Highly-Reflective (HR) layer 18. Printed circuit board 17 includes a metal substrate portion 19, a thin dielectric insulative layer portion 20, a plurality of metal layer portions 16 and 21-24, and a solder mask layer 25. The three blue LED dice 3-5 are mounted to central metal layer portion 16. Blue LED die 3 is denoted "A". Blue LED die 4 is denoted "B". Blue LED die 5 is denoted "C". The three blue LED dice 3-5 are mounted to the substrate in a triangular pattern as illustrated.

Retaining ring 12 of molded silicone forms a circular wall that surrounds the outer periphery of phosphor 13. Phosphor 13 actually involves phosphor particles suspended in a substantially transparent binding material such as silicone. In the fabrication process, uncured liquid phosphor is applied into the central round dammed region defined by the circular inside wall of retaining ring 12. The upper surface of the liquid phosphor may have a domed upper contour as illustrated in FIG. 1. The silicone then cures and hardens. The phosphor particles are suspended in the cured silicone. The silicone and the phosphor particles are referred to together here as a "phosphor". Phosphor 13 covers the three LED dice 3-5 as illustrated in FIG. 1.

Substrate 2 includes a first substrate terminal 26 (T1), a second substrate terminal 27 (T2), a third substrate terminal 28 (T3), and a fourth substrate terminal 29 (T4). First substrate terminal 26 is an exposed square portion of metal layer portion 21 that is not covered by solder mask 25. Second substrate terminal 27 is an exposed square portion of metal layer portion 22 that is not covered by solder mask 25. Third substrate terminal 28 is an exposed square portion of metal layer portion 23 that is not covered by solder mask 25. Fourth substrate terminal 29 is an exposed square portion of metal layer portion 24 that is not covered by solder mask 25.

Figure 2:
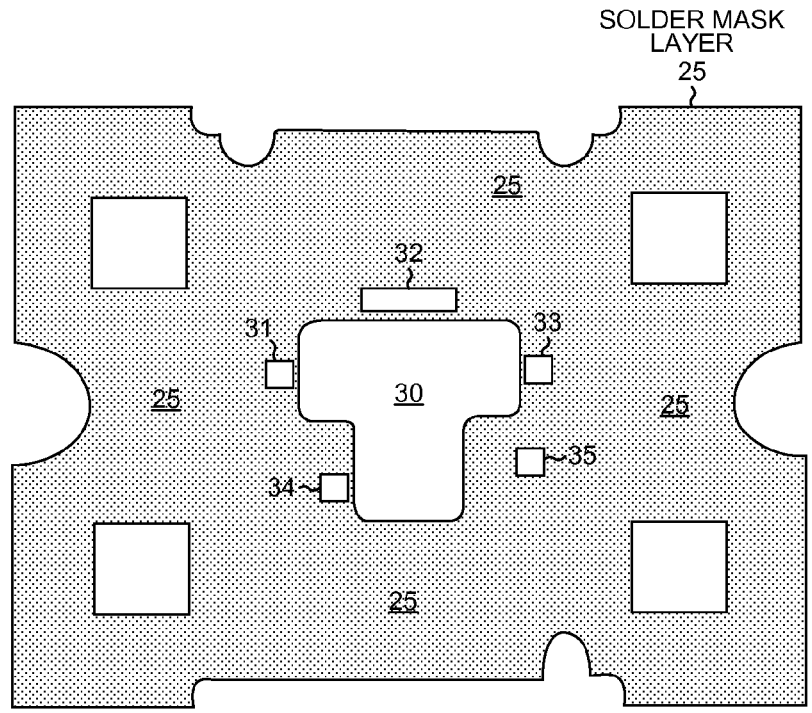
FIG. 2 is top-down diagram of the solder mask layer of the white LED assembly of FIG. 1.

FIG. 2 is a top-down diagram of the solder mask layer 25. Solder mask layer 25 covers most of the area of the upper surface of PCB 17 outside retaining ring 12 other than the substrate terminals 26-29. The solder mask layer 25 also covers much of the area of the upper surface of the PCB within the circular area defined by retaining ring 12. There is an opening or hole 30 in solder mask 25 so that the solder mask does not cover the central metal layer portion 16.

There are also openings or holes 31-35 in the solder mask layer 35 so that the solder mask does not cover wire bond areas 36-40 (see FIG. 1) of the underlying metal layer portions.

Figure 3:
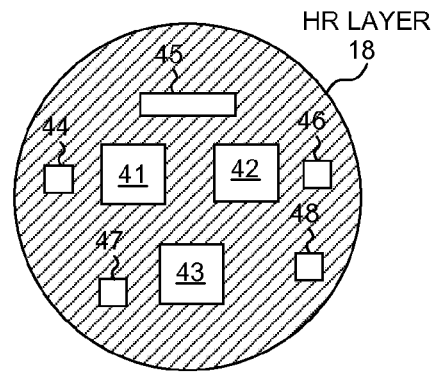
FIG. 3 is a top-down diagram of the HR layer of the white LED assembly of FIG. 1.

FIG. 3 is a top-down diagram of HR layer 18. In this example, the material of the HR layer 18 has a reflectivity of at least 85 percent and may be the KER-2010-DAM material or the KER-2020 material that is commercially available from ShinEtsu Chemical Co. Ltd. of Tokyo, Japan. The HR material typically comprises silicone and a titanium dioxide powder, where the titanium dioxide powder is suspended in the silicone. In the illustrated example of FIG. 3, HR layer 18 is only disposed within the circular confines of retaining ring 12 (see FIG. 1). HR layer 18 has a circular outer peripheral edge. HR layer 18 does not cover wire bond areas 36-40. HR layer 18 extends over much of the central metal layer portion 16 but for three openings 41-43 (also referred to as holes or windows). Blue LED die 3 is mounted to metal layer portion 16 within opening 41 (see FIG. 1). Blue LED die 4 is mounted to metal layer portion 16 within opening 42. Blue LED die 5 is mounted to metal layer portion 16 within opening 43. In the present example, HR layer 18 is painted onto the top of the PCB 17 in a screen printing process or in a microjetting process. Openings or holes 44-48 in HR layer 18 as shown in FIG. 3 are of substantially identical size and location to openings or holes 31-35 in the solder mask layer 35 as shown in FIG. 2.

Figure 4:
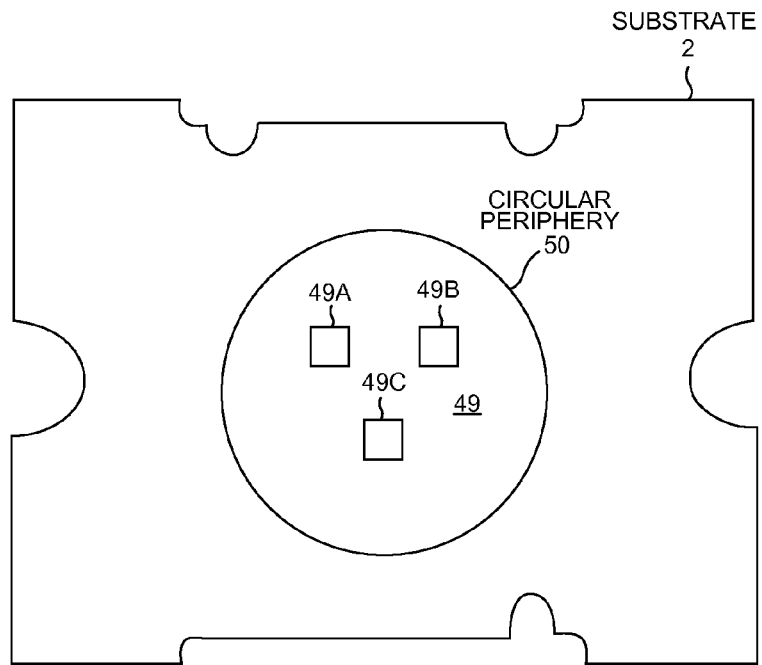
FIG. 4 is a top-down diagram showing the circular portion of the top surface of the substrate that is contacted by the single contiguous amount of phosphor of the white LED assembly of FIG. 1.

FIG. 4 is a top-down diagram that shows the portion 49 of the upper surface of substrate 2 that is contacted by phosphor 13. Portion 49 has a circular outer periphery 50. Phosphor 13 does not contact substrate 2 within area 49A because this area is covered by blue LED die A 3. Phosphor 13 does not contact substrate 2 in area 49B because this area is covered by blue LED die B 4. Phosphor 13 does not contact substrate 2 in area 49C because this area is covered by blue LED die C 5.

FIG. 5 is a top-down diagram of white LED assembly 1 with retaining ring 12 and HR layer 18 not shown. First wire bond 6 couples the first substrate terminal T1 to the first electrode of first LED die A 3. Wire bond 6 is coupled so that it is part of a first end node of the LED string. Second wire bond 7 couples the second electrode of the first LED die A 3 to substrate terminal T2. Wire bond 7 is coupled so that it is part of a first intermediate node of the LED string. Third wire bond 8 couples the second substrate terminal T2 to the first electrode of second LED die B 4. Wire bond 8 is coupled so that it is part of the first intermediate node of the LED string. Fourth wire bond 9 couples the second electrode of second LED die B 4 to third substrate terminal T3. Wire bond 9 is coupled so that it is part of a second intermediate node of the LED string. Fifth wire bond 10 couples the third substrate terminal T3 to the first electrode of third LED die C 5. Wire bond 10 is coupled so that it is part of the second first intermediate node of the LED string. Sixth wire bond 11 couples the second electrode of third LED die C 5 to the fourth substrate terminal T4. Wire bond 11 is coupled so that it is part of a second end node of the LED string.

Figures 6, 7, 13:
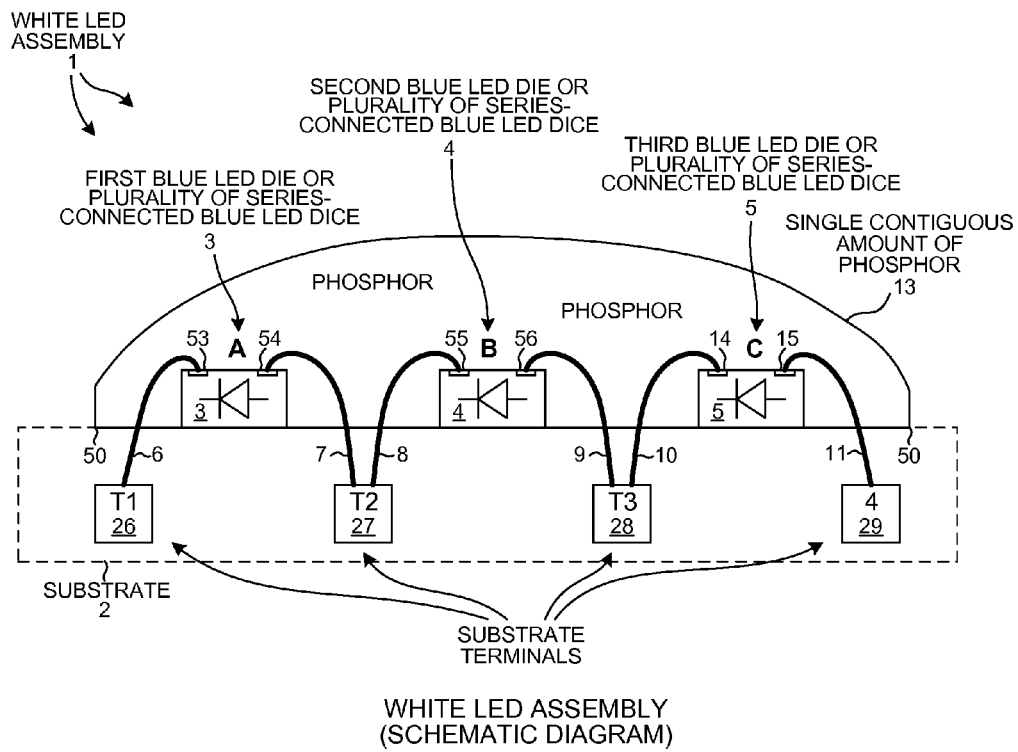
FIG. 6 is a simplified cross-sectional schematic diagram of the white LED assembly of FIG. 1.
FIG. 7 is a table that sets forth various ways that substrate terminals T1-T4 of the white LED assembly of FIG. 1 can be driven.
FIG. 13 is a table that sets forth various ways that the substrate terminals T1-T4 of FIGS. 11 and 12 can be driven.

FIG. 6 is a schematic diagram of white LED assembly 1. The first and second electrodes of LED die A 3 are identified by reference numerals 53 and 54, respectively. The first and second electrodes of LED die B 4 are identified by reference numerals 55 and 56, respectively. The first and second electrodes of LED die C 5 are identified by reference numerals 14 and 15, respectively. The LED dice 3-5 are coupled together as a string of series-connected blue LED dice in that a current can flow in a forward bias condition through the string from electrode 15, through forward biased LED die 5 to electrode 14, to electrode 56, through forward biased LED die 4 to electrode 55, to electrode 54, and through forward biased LED die 3 to electrode 53. Substrate terminal 26 is a part of the first end node of the LED string. Substrate terminal 29 is a part of the second end node of the LED string. Substrate terminal 27 is a part of the first intermediate node along the LED string. Substrate terminal 28 is a part of the second intermediate node along the LED string.

FIG. 7 is a table that sets forth various ways that substrate terminals T1-T4 of the embodiment of FIGS. 1-6 can be driven. In the table, "F" indicates floating in that the substrate terminal is not being driven. In the table, "H" indicates a positive voltage is supplied onto the substrate terminal, and that this positive voltage is high enough to forward bias the LEDs that are in a current path between this substrate terminal and the substrate terminal identified in the row of the table by the "L" symbol. The "L" symbol indicates a voltage lower than the "H", where the voltage difference between the "H" and the "L" is adequate to forward bias the LEDs in the current path between the "H" designated substrate terminal and the "L" designated substrate terminal.

For example, the upper row of the table indicates that driving a high voltage "H" onto terminal T2 and driving a low voltage "L" (for example, ground potential) onto terminal T1, while floating terminals T3 and T4, results in LED die A being turned on and LED dice B and C being off. The second uppermost row of the table indicates that driving a high voltage "H" onto terminal T3 and driving a low voltage "L" (for example, ground potential) onto terminal T2, while floating terminals T1 and T4, results in LED die B being turned on and LED dice A and C being off. The third row of the table indicates that driving a high voltage "H" onto terminal T4 and driving a low voltage "L" (for example, ground potential) onto terminal T3, while floating terminals T1 and T2, results in LED die C being turned on and LED dice A and B being off. The fourth row of the table indicates that driving a high voltage "H" onto terminal T4 and driving a low voltage "L" (for example, ground potential) onto terminal T1, while floating terminals T2 and T3, results in LED dice A, B and C all being turned on. The fifth row of the table indicates that driving a high voltage "H" onto terminal T3 and driving a low voltage "L" (for example, ground potential) onto terminal T1, while floating terminals T2 and T4, results in LED dice A and B being turned on and LED die C being off. The sixth row of the table indicates that driving a high voltage "H" onto terminal T4 and driving a low voltage "L" (for example, ground potential) onto terminal T2, while floating terminals T1 and T3, results in LED dice B and C being turned on and LED die A being off. The seventh row of the table indicates that driving a high voltage "H" onto terminal T4 and driving a low voltage "L" (for example, ground potential) onto terminal T1, while shorting terminals T2 and T3 together, results in LED die A and C being turned on and LED die B being off. Floating (not driving) all the terminals T1-T4 results in all the LED dice A, B and C being off.

Figure 8:
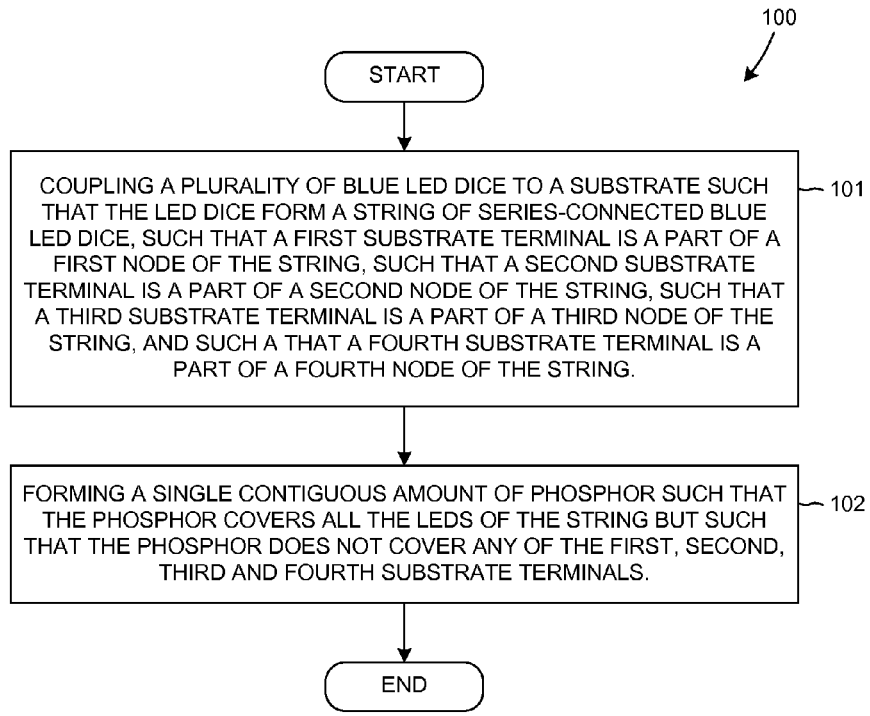
FIG. 8 is a simplified flowchart of a method in accordance with one novel aspect.

FIG. 8 is a flowchart of a method 100 in accordance with one novel aspect. A plurality of blue LED dice is coupled (step 101) to a substrate such that the LED dice form a string of series-connected blue LED dice, such that a first substrate terminal is a part of a first node of the string, such that a second substrate terminal is a part of a second node of the string, such that a third substrate terminal is a part of a third node of the string, and such that a fourth substrate terminal is a part of a fourth node of the string. In one example, the blue LED dice are coupled to the substrate using heat conductive silver epoxy glue. An amount of phosphor is formed (step 102) such that a single contiguous amount of phosphor covers all the LEDs of the string but such that the phosphor does not cover any of the first, second, third and fourth substrate terminals. In one example, the single contiguous amount of phosphor contacts a portion of the top surface of the substrate, the phosphor contacts no part of the substrate other than the portion, and the portion has a circular periphery.

In the embodiment described above of FIGS. 1-8, there is a first single LED coupled between terminals T1 and T2, there is a second single LED coupled between terminals T2 and T3, and there is a third single LED coupled between terminals T3 and T4. In other embodiments, any one of these single LEDs can be replaced with a string of multiple series-connected blue LED dice. In other embodiments, a string of multiple series-connected blue LED dice includes a first end node, a second end node, and three or more intermediate nodes, where each corresponding respective one of a plurality of substrate terminals is coupled to each corresponding respective one of the nodes of the string, where none of the substrate terminals is covered by phosphor, but where all the LEDs of the string are covered by a single contiguous amount of phosphor. The substrate can have any suitable shape and need not have a rectangular shape when considered from a top-down perspective.

Figures 9, 10:
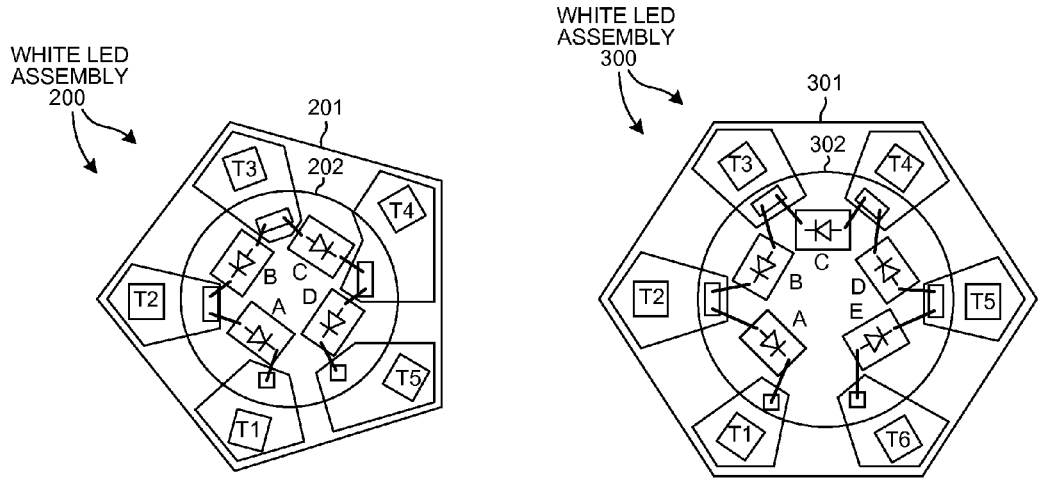
FIG. 9 is a top-down diagram of an embodiment of a white LED assembly having five substrate terminals.
FIG. 10 is a top-down diagram of an embodiment of a white LED assembly having six substrate terminals.

FIG. 9 is a simplified top-down diagram of an example of a white LED assembly 200 involving a string of four series-connected blue LEDs A-D and five substrate terminals T1-T5. All the LEDs A-D of the string are covered by a single contiguous amount of phosphor, and none of the substrate terminals T1-T5 is covered by phosphor. The outer shape of the substrate 201 need not be a pentagon, but rather can be another shape such as a rectangle. Any of the single LEDs A-D in FIG. 9 can be replaced with a string of series-connected LED dice. Reference numeral 202 identifies the outer periphery of the single contiguous amount of phosphor.

FIG. 10 is a simplified top-down diagram of an example of a white LED assembly 300 involving a string of five series-connected blue LEDs A-E and six substrate terminals T1-T6. All the LEDs A-E of the string are covered by a single contiguous amount of phosphor, and none of the substrate terminals T1-T6 is covered by phosphor. The outer shape of the substrate 301 need not be a hexagon, but rather can be another shape such as a rectangle. Any of the single LEDs A-E can be replaced with a string of series-connected LED dice. Reference numeral 302 identifies the outer periphery of the single contiguous amount of phosphor.

FIG. 1 illustrates an example of a white LED assembly with four substrate terminals; FIG. 9 illustrates an example of a white LED assembly with five substrate terminals; FIG. 10 illustrates an example of a white LED assembly with six substrate terminals. The common scheme employed can be extended to white LED assemblies with more than six substrate terminals.

Although examples are set forth above where all intermediate nodes of the LED string have associated substrate terminals, in other examples an intermediate node may not have an associated substrate terminal (where the substrate terminal is a part of the intermediate node). Whereas in a previously described embodiment a first electrode of a first LED is coupled by a first bond wire to a substrate terminal at an intermediate node, and a second electrode of a second LED is coupled by a second bond wire to the same substrate terminal at the same intermediate node, the first electrode of the first LED may be directly coupled via a bond wire to the second electrode of the second LED. There is no substrate terminal that is a part of this intermediate node.

Figure 11:
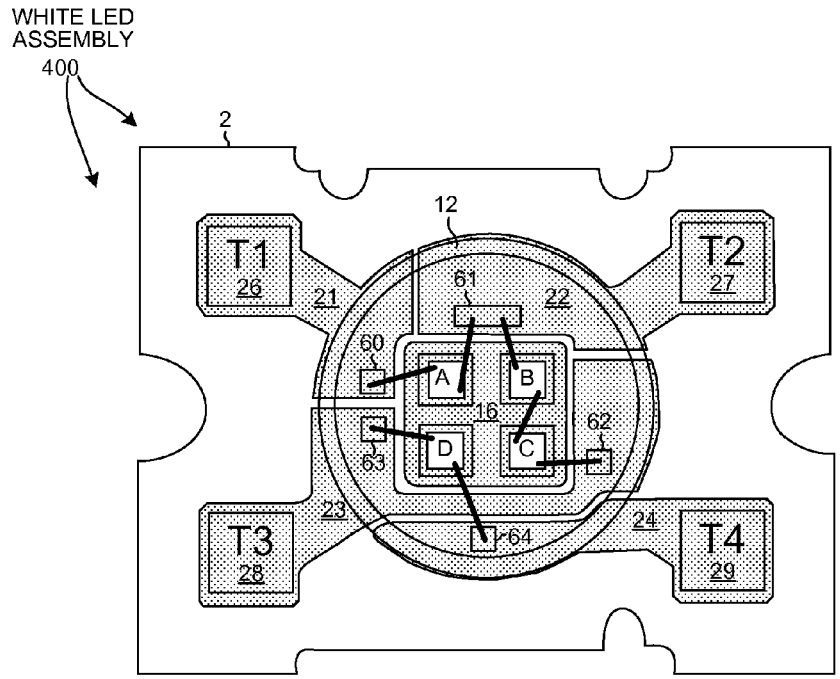
FIG. 11 is a top-down diagram of an embodiment involving four substrate terminals and four blue LED dice.
Figure 12:
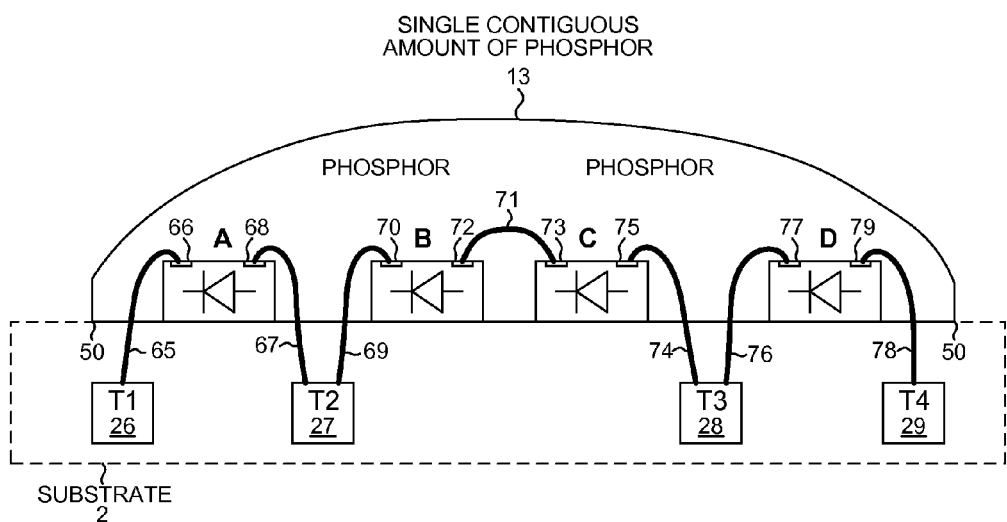
FIG. 12 is a cross-sectional schematic diagram of the embodiment of FIG. 11.

FIG. 11 is a top-down diagram of an example of a white LED assembly 400 involving four blue LED dice A, B, C and D. The four blue LED dice A, B, C and D are disposed on a metal layer portion 16 of a substrate 2. The four blue LED dice are covered by a single contiguous amount of phosphor 13. FIG. 12 is a simplified cross-section schematic diagram of white LED assembly 400. The portion of the upper surface of substrate 2 that is contacted by phosphor 13 has a circular outer periphery 50 when considered from the top-down perspective.

Rather than there being a single blue LED die coupled between terminals T3 and T2 as in the embodiment pictured in FIG. 6, in the embodiment of FIG. 12 there are two series-connected blue LED dice C and B coupled in series between terminals T3 and T2. Reference numeral 60 identifies a wire bond area to metal layer portion 21. Reference numeral 61 identifies a wire bond area to metal layer portion 22. Reference numerals 62 and 63 identify wire bond areas to metal layer portion 23. Reference numeral 64 identifies a wire bond area to metal layer portion 24.

As shown in FIG. 12, wire bond 65 couples substrate terminal T1 to a first electrode 66 of LED A. A wire bond 67 couples a second electrode 68 of LED A to substrate terminal T2. A wire bond 69 couples substrate terminal T2 to a first electrode 70 of LED B. A wire bond 71 couples a second electrode 72 of LED B to a first electrode 73 of LED C. A wire bond 74 couples a second electrode 75 of LED C to substrate terminal T3. A wire bond 76 couples substrate terminal T3 to a first electrode 77 of LED D. A wire bond 78 couples a second electrode 79 of LED D to substrate terminal T4. There is no substrate terminal that is part of the intermediate node involving wire bond 71 and electrodes 72 and 73.

FIG. 13 is a table that sets forth various ways that the substrate terminals T1-T4 of the embodiment of FIGS. 11 and 12 can be driven.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
   a hexagonal substrate having a first terminal, a second terminal, a third terminal, and a fourth terminal;
   a first light emitting diode (LED);
   a second LED;
   a third LED, wherein the first LED, the second LED and the third LED are coupled together as a string of series-connected LEDs such that a current flows from the first terminal, through the first LED, through the second terminal, through the second LED, through the third terminal, through the third LED and to the fourth terminal, wherein the second terminal is a part of an intermediate node along the string, and wherein the first LED, the second LED, and the third LED are fixed to the substrate in a triangular pattern; and
   a single contiguous amount of phosphor that contacts the substrate and that covers the first LED, the second LED and the third LED, wherein the single contiguous amount of phosphor does not cover any of the first, second, third or fourth terminals.

2. The device of claim 1, wherein the single contiguous amount of phosphor contacts a portion of a top surface of the substrate, wherein the portion has a periphery, wherein the first LED is fixed to the substrate within the periphery, wherein the second LED is fixed to the substrate within the periphery, and wherein the third LED is fixed to the substrate within the periphery.

3. The device of claim 2, wherein the periphery has a circular shape.

4. The device of claim 3, wherein the substrate has a first corner, a second corner, a third corner and a fourth corner, wherein the first terminal is located closer to the first corner than to any of the second, third and fourth corners, wherein the second terminal is located closer to the second corner than to any of the first, third and fourth corners, wherein the third terminal is located closer to the third corner than to any of the first, second and fourth corners, and wherein the fourth terminal is located closer to the fourth corner than to any of the first, second and third corners.

5. The device of claim 1, wherein the substrate comprises a printed circuit board and a layer of highly reflective material, wherein the highly reflective material comprises silicone and titanium dioxide powder, wherein the layer of highly reflective material is disposed on a portion of a top surface of the printed circuit board, and wherein the single contiguous amount of phosphor contacts the layer of highly reflective material.

6. The device of claim 1, wherein the single contiguous amount of phosphor comprises phosphor particles suspended in a substantially transparent binding material.

7. The device of claim 1, wherein a first wire bond couples the first terminal to the first LED, wherein a second wire bond couples the second terminal to the first LED, wherein a third wire bond couples the second terminal to the second LED, wherein a fourth wire bond couples the third terminal to the second LED, wherein a fifth wire bond couples the third terminal to the third LED, and wherein a sixth wire bond couples the fourth terminal to the third LED.

8. The device of claim 7, wherein the first LED, the second LED, and the third LED are fixed to the substrate using silver epoxy.

9. The device of claim 1, wherein the first LED is a blue LED die.

10. The device of claim 1, wherein the single contiguous amount of phosphor is contained within a retaining ring.

11. A method comprising:
coupling a plurality of LED dice to a hexagonal substrate such that the LED dice form a string of series-connected LED dice, such that a first terminal is a part of a first node of the string, such that a second terminal is a part of a second node of the string, such that a third terminal is a part of a third node of the string, and such that a fourth terminal is a part of a fourth node of the string, wherein three of the LED dice are coupled to the substrate in a triangular pattern; and
forming a single contiguous amount of phosphor such that the phosphor contacts the substrate and covers the string of LEDs but such that the phosphor does not cover any of the first, second, third or fourth terminals, wherein the string of series-connected LED dice, the substrate, and the single contiguous amount of phosphor together comprise an LED assembly.

12. The method of claim 11, wherein the single contiguous amount of phosphor is formed such that the single contiguous amount of phosphor contacts a portion of a top surface of the substrate, wherein the single contiguous amount of phosphor does not contact any part of the substrate other than the portion, and wherein the portion has a circular periphery.

13. The method of claim 11, wherein the coupling comprises:
wire bonding the first terminal to a first electrode of a first LED die;
wire bonding the second terminal to a second electrode of the first LED die;
wire bonding the second terminal to a first electrode of a second LED die;
wire bonding the third terminal to a second electrode of the second LED die;
wire bonding the third terminal to a first electrode of a third LED die; and
wire bonding the fourth terminal to a second electrode of the third LED die, wherein the first, second and third LED dice together are the string of series-connected LED dice.

14. The method of claim 11, wherein the coupling involves fixing the plurality of LED dice to the substrate using silver epoxy.

15. The method of claim 11, wherein the substrate includes a highly reflective layer, and wherein the single contiguous amount of phosphor is formed so that the single contiguous amount of phosphor covers the highly reflective layer.

16. A device comprising:
a hexagonal substrate having a first terminal, a second terminal, and a third terminal;
a first LED die;
a second LED die;
a single contiguous amount of phosphor that covers the first LED die, that covers the second LED die, and that contacts the substrate, wherein the single contiguous amount of phosphor does not cover any of the first, second and third terminals, wherein the single contiguous amount of phosphor is contained within a retaining ring, and wherein the first terminal, the second terminal and the third terminal are disposed outside the retaining ring;
first means for coupling the first terminal to a first electrode of the first LED die;
second means for coupling the second terminal to a second electrode of the first LED die, and for coupling the second terminal to a first electrode of the second LED die; and
third means for coupling the third terminal to a second electrode of the second LED die.

17. The device of claim 16, wherein the first means comprises a bond wire, wherein the second means comprises a pair of bond wires, and wherein the third means comprises a bond wire.

18. The device of claim 17, wherein the first means further comprises a wire bond area of a first metal layer portion, wherein the second means further comprises a wire bond area of a second metal layer portion, wherein the third means further comprises a wire bond area of a third metal layer portion, and wherein the first, second, and third metal layer portions are parts of the substrate.

19. The device of claim 18, wherein the first LED die is a blue LED die, and wherein the second LED die is a blue LED die.

20. The device of claim 19, wherein the substrate comprises a printed circuit board and a layer of highly reflective material, wherein the highly reflective material comprises a titanium dioxide powder suspended in silicone.

* * * * *